(12) United States Patent
Sunter

(10) Patent No.: US 6,492,798 B2
(45) Date of Patent: Dec. 10, 2002

(54) METHOD AND CIRCUIT FOR TESTING HIGH FREQUENCY MIXED SIGNAL CIRCUITS WITH LOW FREQUENCY SIGNALS

(75) Inventor: Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 09/842,700

(22) Filed: Apr. 27, 2001

(65) Prior Publication Data

US 2002/0158620 A1 Oct. 31, 2002

(51) Int. Cl.[7] .............................................. G01R 13/34
(52) U.S. Cl. ..................... 324/76.15; 326/93; 341/118; 341/120; 327/407; 324/76.59
(58) Field of Search ........................... 324/73.1, 76.15, 324/76.59, 763, 158.1; 326/93; 341/118, 120; 327/407

(56) References Cited

U.S. PATENT DOCUMENTS

| | | | |
|---|---|---|---|
| 4,641,246 A | * | 2/1987 | Halbert et al. .......... 324/121 R |
| 5,578,935 A | | 11/1996 | Burns |
| 5,589,763 A | | 12/1996 | Burns |
| 5,673,277 A | | 9/1997 | Amitai et al. |
| 5,748,124 A | | 5/1998 | Rosenthal et al. |
| 5,825,786 A | | 10/1998 | Buns |
| 5,909,186 A | | 6/1999 | Gohringer |
| 6,175,939 B1 | | 1/2001 | Dinteman |
| 6,194,911 B1 | | 2/2001 | Currin et al. |
| 6,339,388 B1 | * | 1/2002 | Matsumoto .............. 324/158.1 |

OTHER PUBLICATIONS

Mason .et al., "Analog DFT Using an Undersampling Technique", IEEE Design & Test of Computers, 1999, p.84–88.
Mason et al., "Mixed Signal DFT at GHz Frequencies", 16th IEEE VLSI Test Symposium, Apr. 36–30, 1998, p. 245–251.
Hefed et. al., At Stand–Alone Integrated Circuit Core for Time and Frequency Domain Measurements, ITC Internationa Test Conference, 2000, p. 1031–1040.

\* cited by examiner

*Primary Examiner*—Christine Oda
*Assistant Examiner*—Vincent Q. Nguyen

(57) ABSTRACT

A method of testing an analog, or mixed analog and digital, circuit designed for operation at a clock frequency multiplexes a plurality of low frequency stimulus signals using a high frequency clock to produce a circuit input signal, applies the input signal to the circuit to obtain a circuit output signal; samples the circuit output signal synchronously with the high frequency clock at a frequency equal to the clock frequency divided by the number of the low frequency signals; stores the samples and measures properties of the signal samples to determine properties of the output signal of the circuit.

33 Claims, 14 Drawing Sheets

METHOD AND CIRCUIT FOR TESTING HIGH FREQUENCY MIXED SIGNAL CIRCUITS WITH LOW FREQUENCY SIGNALS

The present invention relates, in general, to the testing of circuits and, more specifically, to a method and circuit for testing high-frequency mixed-signal circuits with a low-frequency tester.

BACKGROUND OF THE INVENTION

The number of integrated circuits (ICs) that contain mixed-signal (analog and digital) circuitry is increasing as a percentage of all ICs, and is expected by industry observers to exceed 60% in 2001. The number of digital pins of these ICs is also increasing and can exceed 1000 pins, and the digital data rate applied to the pins is increasing and can exceed 500 MHz. Digital testers that achieve these pin counts and data rates can cost several million dollars. Adding mixed-signal test capability to one of these testers can increase its price by 20% to 40%.

Mixed-signal testers are significantly more expensive than digital testers, primarily for three reasons: (1) a high signal-to-noise ratio (SNR) must be achieved in the presence of many high speed digital signals; (2) the analog stimulus frequencies must be a precise fraction of the digital clock frequencies; and (3) the analog circuitry of the tester must operate at higher speed and accuracy than the circuits to be tested.

The two most common mixed-signal circuits are analog-to-digital converters (ADCs) and digital-to-analog converters (DACs). The accuracy and speed of converters has increased over the years, and can exceed 16 bits at 100 MHz. To test converters, a tester typically needs to be faster and more accurate than the converter being tested, but it is becoming more difficult and expensive for testers to have this performance advantage because tester performance and IC performance are converging as fundamental limits to circuit technology are approached. When testing an ADC or DAC within a larger circuit, an N-bit digital output or input is accessed by the tester as N digital signals in parallel, or serially at a rate equal to N times the sample rate. N is typically between 6 and 16. Testing high frequency (sample rate) DACs and ADCs at their maximum operating speed ("at-speed") is necessary because their performance typically degrades as operating frequency increases.

It is nevertheless possible to test a DAC or ADC at a clock rate that is much less than the normal operating speed of the ADC or DAC. For example, differential non-linearity (DNL), the maximum difference between the actual voltage step sizes and the ideal step size of a DAC, is commonly measured by providing a digital input value to the DAC; measuring the resulting output voltage, V1, for a period long enough to filter out noise; provide a second digital value, higher by one bit, to the DAC; measuring the filtered output voltage, V2; calculating V2–V1; and comparing the calculated value to an ideal value.

Using this sequence, all output voltage differences are measured. However, the DAC is tested at a rate slower than its maximum speed because time must be allowed for a sufficiently accurate measurement of its low-pass filtered output voltage, and, because the output analog voltage increments by only one least significant bit-equivalent at a time, this is much slower than the largest increments that must be converted, which can be more than one half of the $2^N$ step full-range.

U.S. Pat. No. 5,825,786, granted to M. Burns on Oct. 20, 1998, for "Undersampling Digital Testability Circuit," describes a circuit for testing the integrity of high data rate transfers by undersampling the digital input to a DAC being tested, but does not otherwise test the DAC itself. The patent does not teach how to analyze the analog signal output of the DAC to detect defects. Undersampling refers to the technique of sampling a signal at a sample rate that is slower than twice the highest frequency of interest in the sampled signal.

Burns U.S. Pat. Nos. 5,578,935 granted on Nov. 26, 1996, for "Undersampling Digitizer with a Sampling Circuit Positioned on an Integrated Circuit" and 5,589,763 granted on Dec. 31, 1996, for "Coherent Undersampling Digitizer for Use with Automatic Field Test Equipment", are concerned with the difficulties associated with accurate measurement of high frequency signals using Automated Test Equipment caused by stray capacitance and inductance from the fixturing such as wafer probes, handler contactors and device sockets may have a detrimental effect on the high frequency electrical signals to be measured. Exemplary, the settling time of a palette digital to analog converter (DAC) could be difficult to accurately measure through a long wire since the inductance of this long wire would adversely affect the signal to be measured. The '935 patent proposes incorporating a comparator on the same integrated circuit chip as the circuit under test so that stray capacitance and inductance is minimized if not eliminated. The '763 patent proposes the use of a coherent undersampling digitizer for use with automatic field test equipment. Both patents describe a method for deducing the value of a periodic signal at any instant in its cycle by repeatedly comparing the signal to a reference voltage that successively approximates the signal based on the result of the comparison. The patents do not teach how to generate a high-frequency stimulus for the CUT without using a high frequency tester. Further, the methods require an algorithmic search for each sample's value, which can produce erroneous results in the presence of high frequency noise.

A paper, entitled "Analog DFT Using an Undersampling Technique" published in 1999 in by R. Mason proposes the use of undersampling to allow the observation of high frequency signals via a low frequency on-chip analog bus. An analog switch samples a signal of interest and uses an analog bus as a sample-and-hold capacitor. The sampling switch is controlled by pulses, having a duration, t, and a period, T, under control of a sampling clock, and is used to observe signals with a bandwidth less than 0.5/t, according to Nyquist theory, while conveying signals on the analog bus at frequencies less than 0.5/T. In the paper, 1 MHz sampling clocks having pulses between 2 and 0.5 ns duration were used to observe signals with between 180 MHz and 1.1 GHz bandwidth. The analog bus signal was conveyed off-chip at frequencies below 500 kHz by an analog buffer. The sampling switch used in this paper is a conventional complementary metal oxide semiconductor (CMOS) transmission gate. Mason does not address the fundamental problem of how to generate a high frequency stimulus for the circuit under test. In addition, the technique requires two high frequency signals, the applied signal and a sampling clock whose frequency is only "slightly offset from the sinusoid signal". For high frequencies, it can be expensive to generate two such frequencies, for example, a 200 MHz sinusoid and a 199.99 MHz square wave, accurately and with low jitter. Further, the technique requires an on-chip hold capacitor, which limits the amount of low pass filtering that can be accomplished with this capacitor to reduce the high frequency noise.

SUMMARY OF THE INVENTION

The present invention seeks to reduce the cost of mixed-signal testers and to simplify high frequency mixed-signal testing by using low frequency stimulus signals; generating and sampling analog signals at a constant low frequency, independently of digital sampling signals used during testing; and facilitating serial data access at rates that are much less than the sampling rate. The present invention also seeks to implement the circuit in a manner that minimizes extra circuitry for circuits constructed according to the IEEE 1149.4 standard.

The term "high frequency" herein refers to the sampling rate or the frequency of the signal input to the device under test. The term "low frequency" refers to the frequencies of signals used to generate the high frequency signal applied to the device under test as well as to the data access rate of the output of the device.

In accordance with the present invention, at least two low frequency signals, each being either an analog signal or a digitally encoded version of an analog signal, are multiplexed using a high frequency clock to produce the required high frequency input stimulus signal which is applied to a circuit under test (CUT). One or more of the low frequency signals can be an unchanging signal (frequency equal to zero). A high frequency output of the CUT is sampled synchronously to the high frequency clock but at a lower frequency. The samples are stored temporarily. Low frequency properties of the signal samples, linearity, for example, are measured to determine properties of the high frequency output of the CUT. It will be seen, therefore, that a tester need not be equipped to generate the high frequency stimulus signal because the high frequency stimulus signal is easily generated from low frequency signals well within the capability of existing mixed signal testers. Further, the tester need not have the capability of processing the results at high speed. The results can be processed at a rate corresponding to the frequency of the low frequency input signals.

The sampling circuitry is preferably located within the same integrated circuit as the CUT. The sampling times and the sampling pulse width are preferably adjustable. The effect of the multiplexer or sampling switches on the signals is minimized by using a modified T-switch, in which the gates of each leg of the T are controlled separately. The multiplexer or sampling switches can be subsumed into an 1149.4 analog boundary module, and controlled by a common clock. If the sampled signals are analog voltages, the capacitance of the storage capacitance can be increased to reduce noise, by connecting an off-chip capacitance in parallel, and signal degradation across the capacitance due to leakage current can be reduced by connecting a current source whose value is equal to the measured leakage current.

One aspect of the present invention is generally defined as a method for testing an analog, or mixed analog and digital, circuit that operates at a clock frequency, the method comprising: multiplexing a plurality of low frequency stimulus signals under control of a high frequency clock to produce a high frequency input stimulus signal; applying the input stimulus signal to a circuit under test so as to obtain a circuit output signal; sampling the circuit output signal synchronously with the high frequency clock at a frequency equal to the clock frequency divided by the number of the plurality of low frequency stimulus signals to produce a sequence of samples; storing said samples; and measuring properties of said samples to determine properties of the circuit.

Another aspect of the present invention is generally defined as a circuit for sampling an analog waveform, the circuit comprising a sampling switch for sampling the analog waveform; a sample storage capacitance including a single capacitance and a plurality of capacitances selectably connected in parallel; a sampling pulse generating circuit for generating pulses having a duration significantly less than one half of the period of a sampling frequency.

A further aspect of the present invention is defined as a circuit for testing an analog, or mixed analog and digital, circuit that operates at a clock frequency, the circuit comprising a multiplexer for multiplexing a plurality of low frequency stimulus signals; multiplexer control means for producing a multiplexer select signal under control of a high frequency clock to cause the multiplexer to sequentially select each of the low frequency stimulus signals and produce a high frequency stimulus signal for application to a circuit under test; sampling means for sampling an output signal of the circuit under test in synchronism with the high frequency clock and at a frequency equal to the clock frequency divided by the number of the plurality of low frequency stimulus signals; means for storing samples produced by said sampling circuit; and means for measuring properties of said samples to determine properties of said circuit under test.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

The test method of the present invention is suitable for testing various analog, or mixed analog and digital circuits. The general method is described first. Then, the method is described as it applies to testing a digital-to-analog converter (DAC), an analog-to-digital converter (ADC), and other mixed-signal functions. Circuits are described that can improve the implementation of the method, and how circuitry constructed according to the IEEE 1149.4 standard can be modified to facilitate using the method.

General Description of the Method

In general, the present invention provides a method for testing an analog, or mixed analog and digital, circuit that is designed to operate at a clock frequency, the method comprising multiplexing a plurality of low frequency stimulus signals using a high frequency clock to produce a circuit input signal, applying the input signal to a circuit under test so as to obtain a circuit output signal, sampling the circuit output signal synchronously with the high frequency clock at a frequency equal to the clock frequency divided by the number of the plurality of said low frequency stimulus signals, storing the samples, and measuring properties of the output signal samples to determine properties of the circuit.

Figure 1:
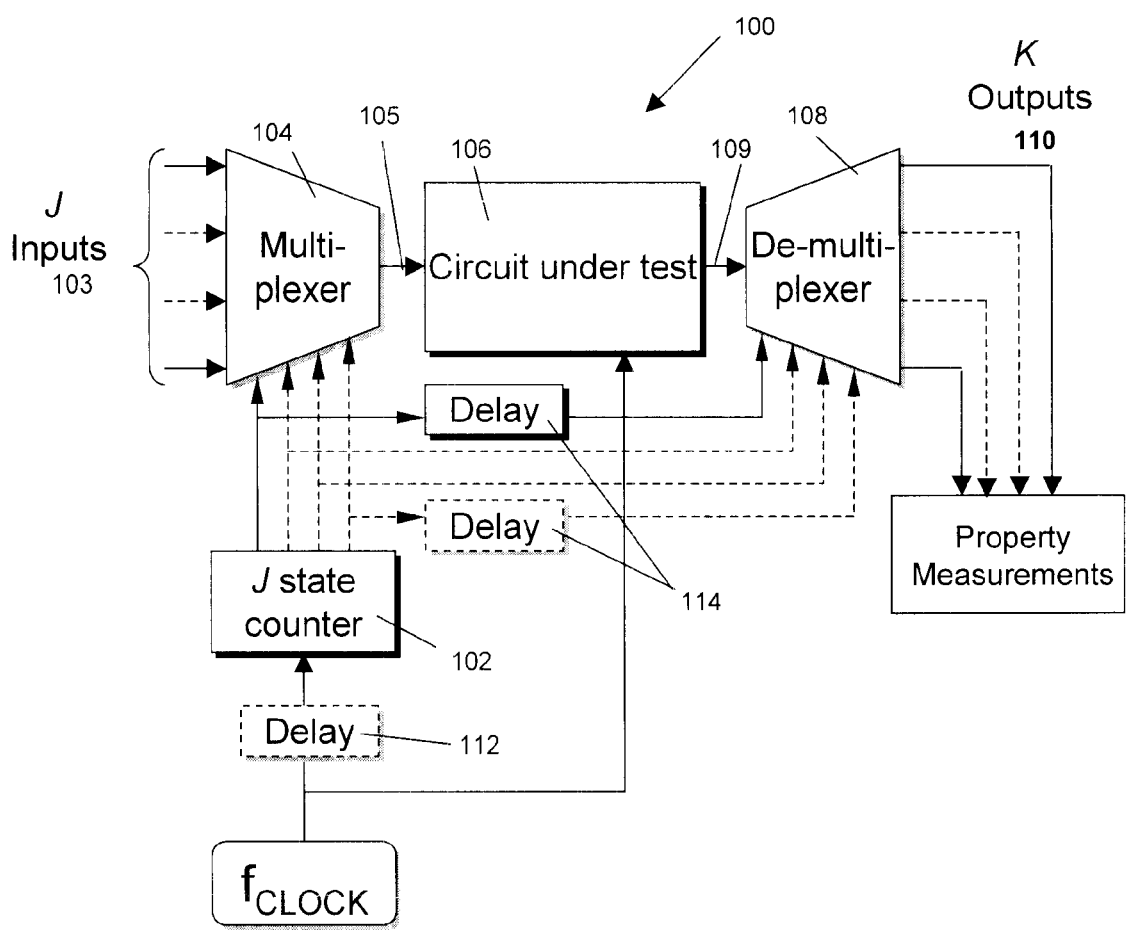
FIG. 1 is a schematic of a circuit for testing a high frequency circuit according to one embodiment of the present invention.

FIG. 1 generally illustrates a circuit 100 according to the present invention. A high frequency stimulus clock signal is applied to a cyclical counter 102 having J unique states. A plurality of low frequency stimulus signals 103, are applied to the inputs of a multiplexer 104. The multiplexer is controlled by the cyclical counter. The number of states, J, of the counter corresponds to the number of low frequency signals 103. The multiplexer may include sample-and-hold circuitry or it may comprise a plurality of switches, each of which simply conveys a selected one of the low frequency signals for the duration of one counter state. The output of the multiplexer is a high frequency, time-multiplexed output signal 105 which is applied to a circuit under test (CUT) 106. If the CUT is a clocked sampling circuit, a stimulus clock signal, or a clock having a frequency synchronous to the stimulus clock signal, $f_{clock}$, is applied to the clock input of the CUT. The cyclical counter also operates under control of the same stimulus clock signal. A de-multiplexer 108 samples the output 109 of the CUT under the control of counter 102 and produces a plurality of output signals 110. The de-multiplexer may be in the form of sample-and-hold circuitry, or in the form of a plurality of switches each of which simply conveys the applied high frequency signal to a respective storage circuit for the duration of one counter state. An output of the de-multiplexer is analyzed to determine characteristics of the CUT.

If the high frequency input to the CUT is an analog signal, the signal can be sampled by an analog sample-and-hold circuit, or by a sampling switch connected to a storage capacitor, and the samples can be analyzed to measure the characteristics of the signal being applied to the CUT. The characteristics of the input signal can be accounted for when analyzing the output of the CUT. Alternatively, the input signal can be adjusted until the measured characteristics have desired or optimum characteristics.

If the high frequency input to the CUT is an analog signal and the CUT is a clocked sampling circuit, the high frequency stimulus clock signal applied to state counter 102 can be selectably delayed, by delay element 112, so that the CUT samples the multiplexer output signal during the transitions from one low frequency signal to the subsequent low frequency signal. Analysis of the output samples of the CUT for this stimulus can reveal the settling time characteristics of the input circuitry of the CUT.

If the high frequency output of the CUT is an analog signal, the analog signal can be sampled by a switch connected to a storage capacitor. While the CUT output is not connected to the sampling switch, an alternative known analog signal can be applied directly to the sampling switch input and the output samples can be analyzed to measure the apparent characteristics of the signal from the CUT. The apparent characteristics of the signal, relative to the known characteristics, can be accounted for when analyzing the output of the CUT.

If the high frequency output of the CUT is an analog signal, the times at which the output of the CUT is sampled can be delayed by delay elements 114 relative to the high frequency stimulus clock signal edges so that the de-multiplexer samples the CUT output signal during the transitions of the signal from one low frequency signal to the subsequent low frequency signal. If sampling is performed by a simple switch that conveys the analog signal to a capacitance, the duration of the sampling pulse can be made significantly narrower than the period of the high frequency clock so that only a small portion of each waveform cycle is sampled, for example, during the CUT output signal transitions. Analysis of the samples of the output of the CUT, with this delayed sampling, can reveal the signal transition characteristics of the output circuitry of the CUT's.

If the storage circuit connected to the de-multiplexer output is a capacitance, the value of the capacitance can be increased by connecting more capacitance in parallel. This is particularly useful if the de-multiplexer is on an integrated circuit where capacitances greater than 20 pF are uneconomical. An off-chip capacitance of, for example, 100 pF, can be connected.

If the storage circuit connected to the de-multiplexer output is a capacitance, inherent leakage current through the capacitance can be measured prior to testing the CUT, and a current source having an equal current value can be connected to the capacitance while testing the CUT.

Testing a DAC

Figure 2A:
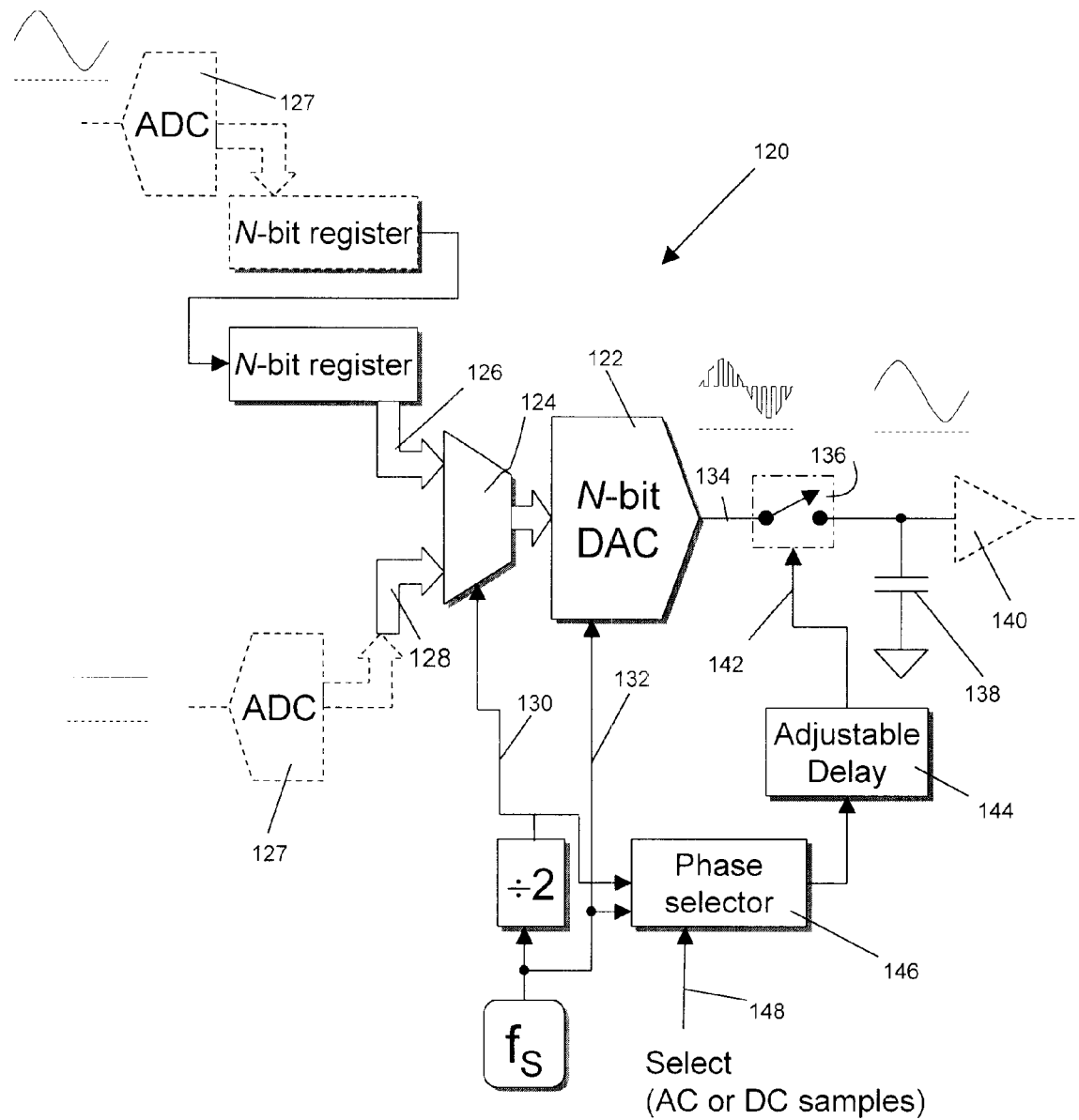
FIG. 2A is a schematic of a circuit for testing a DAC according to the present invention.
Figure 2B:
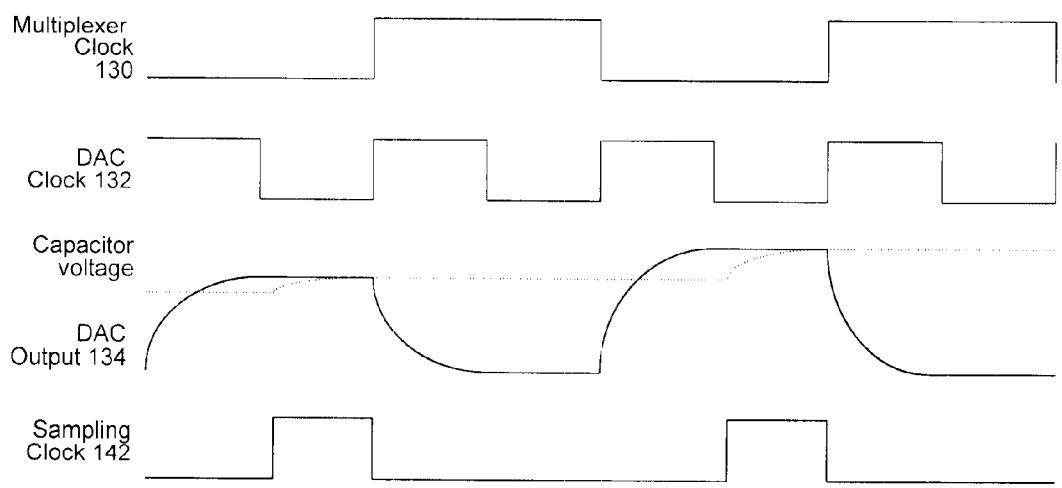
FIG. 2B shows waveforms for signals in the circuit of FIG. 2A when the select signal is logic 0.

Reference will now be made to FIG. 2A, which is a schematic of a circuit 120 for testing a DAC 122 according to the present invention. Access to the digital inputs of the DAC 122 can be serial or parallel. A digital multiplexer 124 connects the DAC input to a first digitally-encoded low frequency stimulus 126, as shown in FIG. 2B, such as a digitally encoded sine wave (as shown), and also connects the DAC input to a second digitally-encoded low frequency stimulus 128, such as a constant DC value (as shown). The select input to the multiplexer is a clock 130, the frequency of which is preferably one half of the frequency of a sampling clock 132 applied to the DAC 122.

Figure 2C:
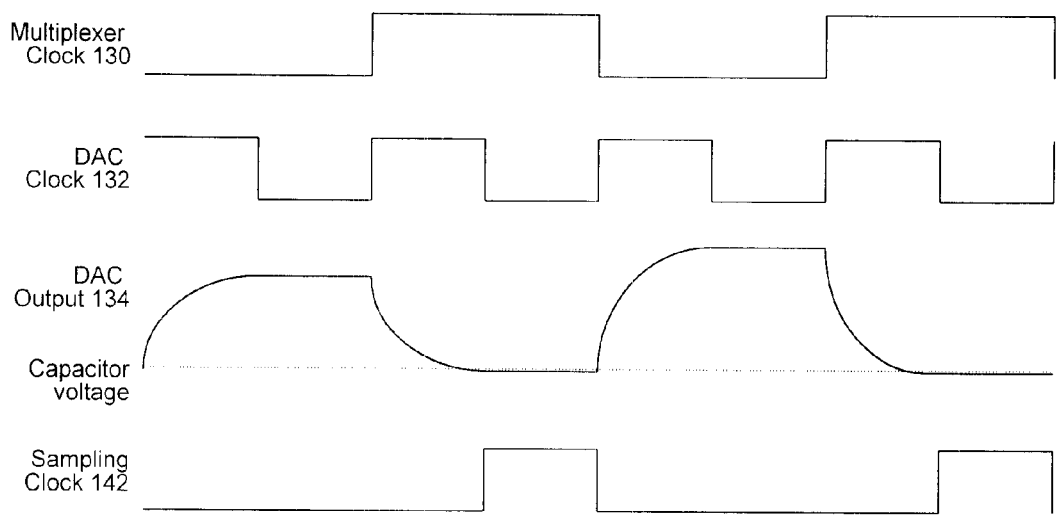
FIG. 2C shows waveforms for signals in the circuit of FIG. 2A when the select signal is logic 1.

The output waveform 134 of the DAC, shown in FIG. 2B and FIG. 2C, alternates between the two low frequency digital stimulus signals 126 and 128 on each successive output sample of the DAC. The clock, $f_S$, provided to the DAC is preferably the maximum clock speed that the DAC can accommodate, and the low frequency stimulus 126 preferably has the maximum amplitude that the DAC can accommodate, so that the output waveform of the DAC contains the maximum frequencies and amplitudes that the DAC can accommodate.

An analog sampling switch 136 is connected between the output of the DAC and a hold capacitance 138 and analog buffer 140, as shown in FIG. 2A. The sampling signal 142 applied to the sampling switch is a periodic pulse whose frequency is preferably the same as that of the digital multiplexer clock, and whose width is preferably less than 50% of the period of the pulse, as shown in FIG. 2B. Circuit 120 further includes an adjustable delay circuit 144 which produces the sampling signal 142 under the control of a phase selector 146. The phase selector receives clock stimulus signal 132 applied to DAC 122 and select signal 130 applied to multiplexer 124 and operates under control of a select input signal 148.

For a defect-free DAC, the waveform across hold capacitance 178 will be approximately equal to one of the two low frequency stimuli, which one it will be depends upon the phase of the sampling pulse relative to the phase of the select signal of the digital multiplexer 156 or 124. FIG. 2B shows the waveforms for one phase and FIG. 2C shows the waveforms for another phase.

Figure 2D:
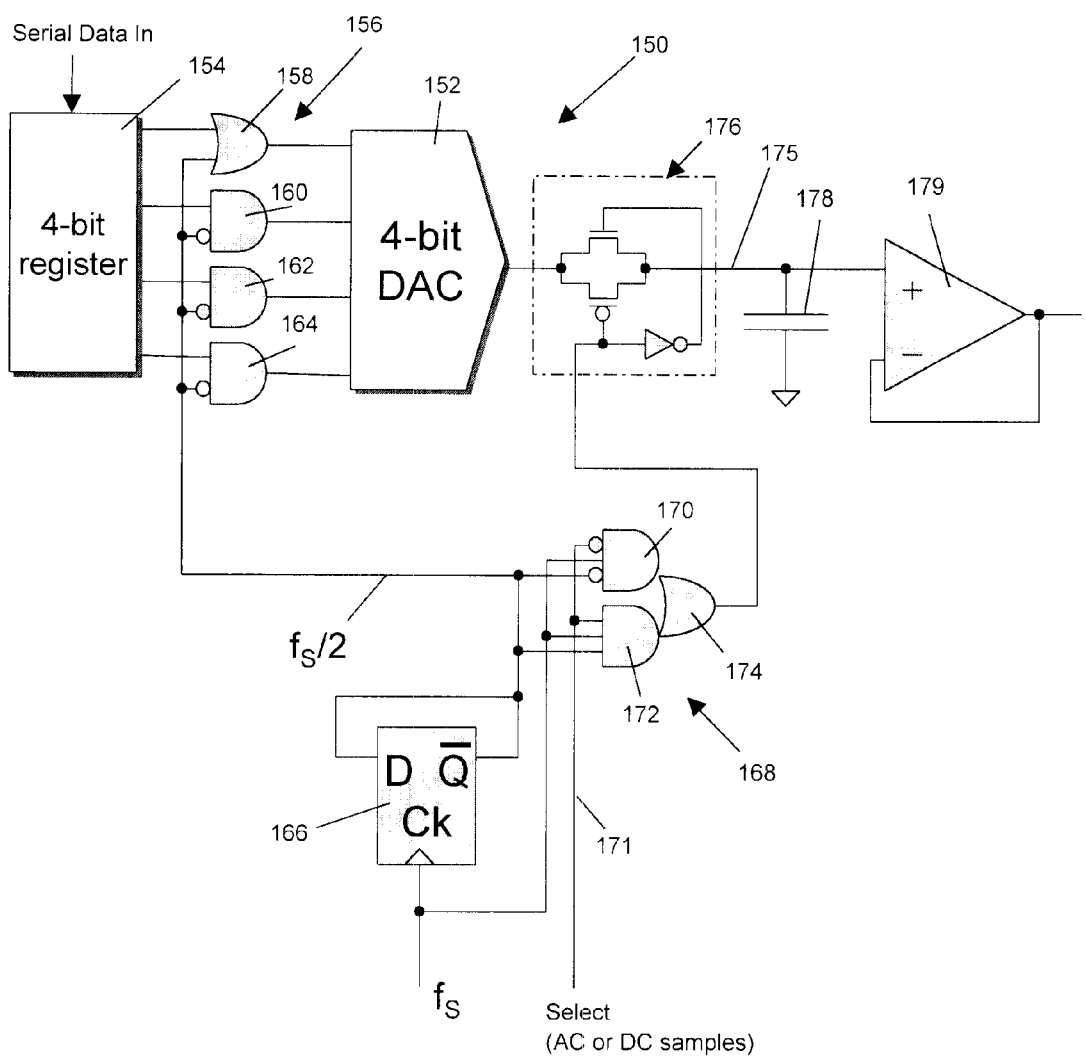
FIG. 2D is a detailed schematic of an example circuit for testing a 4-bit DAC.

FIG. 2D is a detailed schematic of an example circuit 150 for testing a 4-bit DAC 152. The circuit includes a scannable 4-bit register 154 for receiving scan data representative of low frequency signals to be applied to DAC 152. The outputs of the register are applied to a multiplexer logic circuit 156 comprised of an OR gate 158 and AND gates 160,162 and 164. This circuit multiplexes between the constant 4-bit binary value 1000 and the output of the 4-bit register 154. A stimulus clock signal, $f_S$, is applied to the clock input of a flip-flop 166 which divides the input clock by 2. The inverted output Q of flip-flop 166 is fed back to its input D, to cause the divide-by-2 function, and also applied to logic circuit 156 and to switch control circuit 168. Control circuit 168 comprises a pair of AND gates 170 and 172 which receive the output of flip-flop 166 and a select control input signal 171, and an OR gate 174, which receives the output of each of AND gates 170 and 172. The output of DAC 152 is applied to switch 176. The output 175 of the switch 176 is connected to a storage or hold capacitance 178 and to the input of an operational amplifier 179. The output of control circuit 168 is the enable input of switch 176.

The sampling pulse width can be made narrower to select a narrower portion of the output waveform, as described above for the general method. The low frequency stimulus could be any of various waveforms, such as a single frequency sine wave, a multiple frequency sine wave, single linear ramp, a periodic linear ramp, random values, or DC. The DC value could be a minimum value, a mid-range value, or a maximum value.

If the hold capacitance is too small, the clock signal transitions applied to the sampling switch can affect the signal stored on the hold capacitor. The hold capacitance can be arbitrarily large.

The sampling clock frequency of the tester can be chosen to ensure coherent sampling (defined later herein) of one of the low frequency stimuli, especially if the stimulus is sinusoidal. If the low frequency stimulus is a linear ramp, sampling clock edges can also be chosen to coincide with the end of each step of the ramp. In other words, the tester's sampling clock frequency and timing is chosen based on the properties of the low frequency stimulus of interest, almost independent of the DAC's sampling clock frequency. There will be some dependence on the sampling clock frequency of the DAC because the DAC output is preferably sampled coincident with sampling edges of the DAC sampling clock.

The bandwidth of signals and noise that can be observed across the capacitance is limited by the ON-resistance of the sampling switch and by the hold capacitance according to the following equation:

$f_{MAX} < t/2\pi RCT$, where $f_{MAX}$=maximum frequency that can be observed across capacitor (−3 dB bandwidth)
R="ON" resistance of the sampling switch
C=capacitance of the hold capacitor
T=period of the sampling pulse
t=width of the sampling pulse For high resolution DACs, for example, with greater than 12 bits resolution, the sampling switch is preferably a parallel combination of on-chip and off-chip capacitance. This allows more of the high frequency noises to be filtered out and reduces the impact of clock feedthrough from the sampling switch. More noise filtering can be introduced by inserting a resistance between the sampling switch and the capacitor. The impact of the sampling switch clock on the DAC output signal can be reduced by inserting a resistance between the sampling switch and the DAC.

Figure 4:
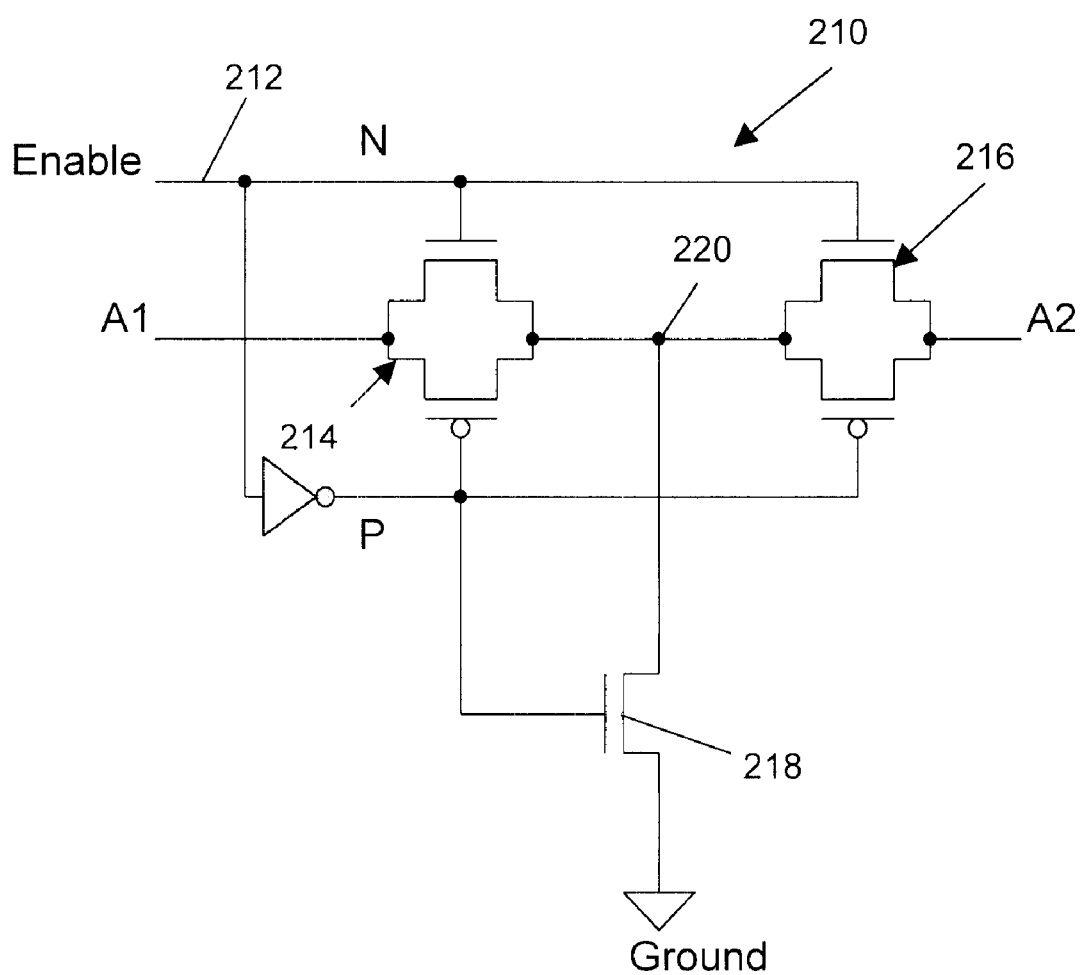
FIG. 4 is a schematic of a prior art T-Switch.

A conventional CMOS transmission gate can be used for the sampling switch. For improved isolation between the high speed DAC output signal and the capacitor voltage when the sampling switch is turned OFF or when no sampling is occurring, a conventional T-switch gate as shown in FIG. 4 can be used.

The quality of the DAC can be tested using conventional analysis of the signal across the hold capacitance, as though a low frequency DAC were being tested. For example, an output sine wave can be converted to digital values with the high resolution, low frequency ADC 127 (FIG. 2A) of a tester, and the resulting digital values analyzed using Fourier transforms (digital signal processing). If the low frequency stimulus waveform is a digital version of a linear ramp, the analog output voltage corresponding to each digital value applied to the DAC can be measured, and the voltage step sizes compared to ideal step sizes to determine DNL.

Some existing commercial DACs have multiple channel outputs. For example, two analog sample-and-hold circuits might be connected to the DAC output. This allows multiple DC or low frequency signals to be driven by a single DAC. According to the present invention, it is possible to use these sample-and-hold circuits as the high frequency de-multiplexer sampling switches mentioned earlier herein. The digital input to the DAC could alternate between a digitized sine wave and a constant digital value. The sample-and-hold circuits would be clocked so that they sample alternate outputs of the DAC. One sample-and-hold output would drive out a low frequency sine wave, and the second output would drive out a DC voltage.

Testing and ADC

The circuitry for testing an ADC is analogous to the circuit just described for testing a DAC. The digital multiplexer is replaced by an analog multiplexer and the analog sampling switch is replaced by a sampling digital register. For the DAC test circuitry, the sampling clock frequency for the analog sampling switch is preferably one half the frequency of the DAC clock, however, for the ADC test circuitry, the sampling register clock frequency can be a much lower frequency than the ADC sampling clock frequency.

Figure 3A:
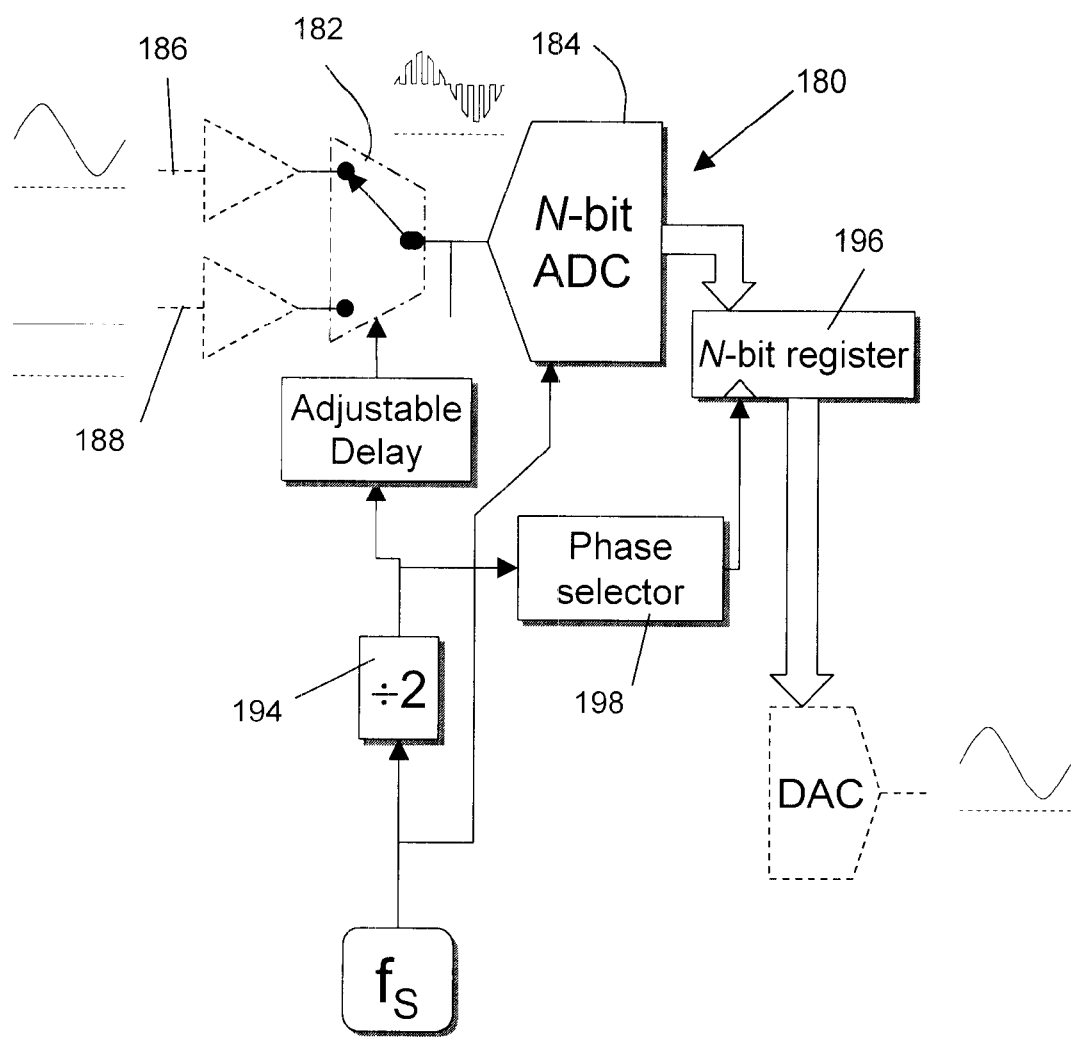
FIG. 3A is a schematic of a circuit for testing a ADC according to one embodiment of the present invention.
Figure 3B:
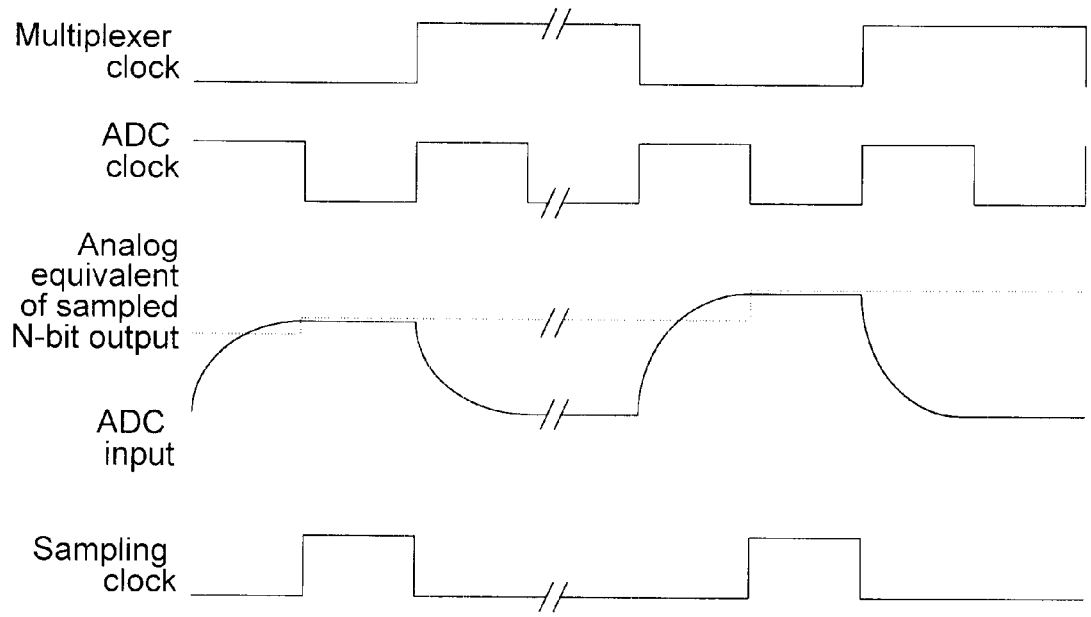
FIG. 3B shows waveforms for signals in the circuit of FIG. 3A when the select signal is logic 0.
Figure 3C:
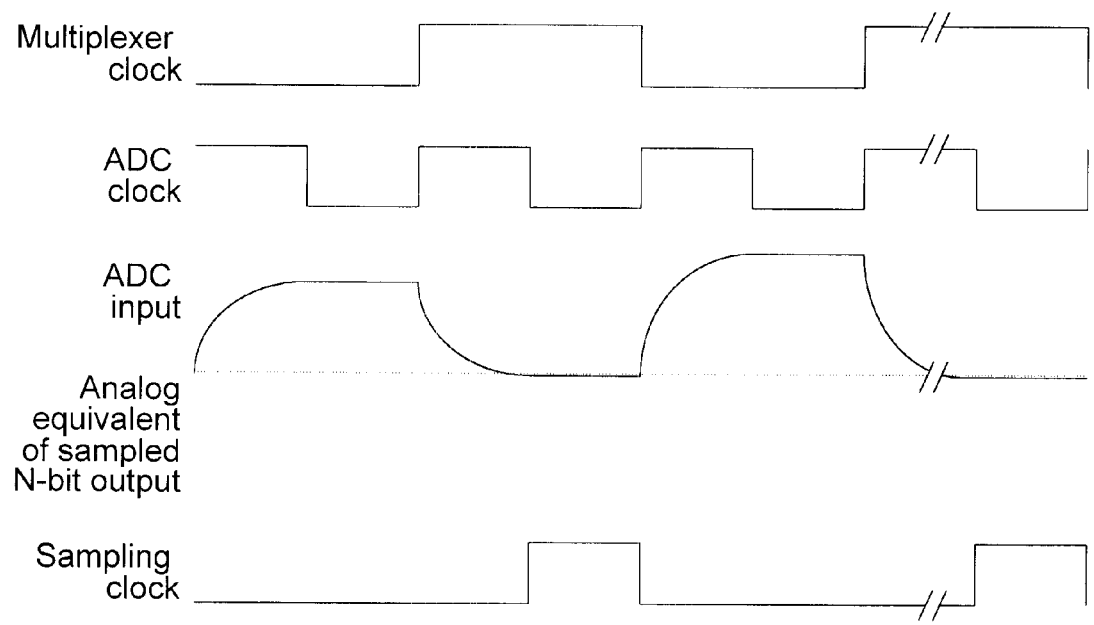
FIG. 3C shows waveforms for signals in the circuit of FIG. 3A when the select signal is logic 1.
Figure 3D:
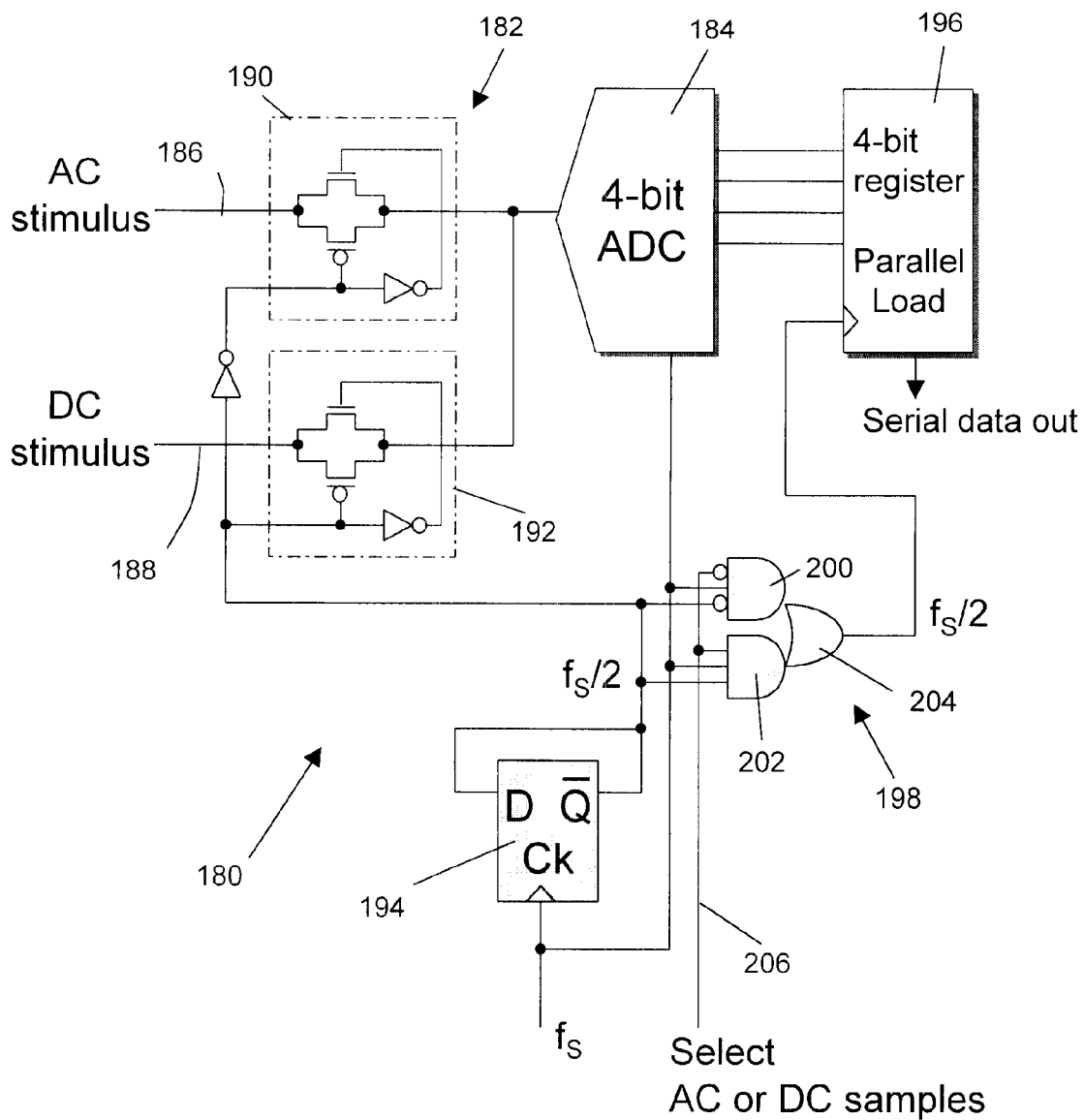
FIG. 3D is a detailed schematic of an example circuit for testing a 4-bit ADC.

FIGS. 3A and 3D illustrate a general and a specific schematic, respectively, of a circuit 180 for testing an ADC according to a further embodiment of the present invention. An analog multiplexer 182 connects the input of ADC 184 to a first low frequency analog stimulus 186, such as a sine wave (as shown), and also connects the ADC input to a second low frequency stimulus 188, such as a constant DC value (as shown). The analog multiplexer can be constructed using two CMOS transmission gates 190 and 192 (FIG. 3D). The control input to the multiplexer is a clock whose frequency is preferably one half of the frequency of the sampling clock, $f_S$, applied to ADC 184. As shown in FIG. 3D, the sampling clock is divided by a flip-flop 194. The digital output of the ADC is applied to an N-bit sampling register 196 clocked by phase selector 198. The phase selector may be in the form shown in FIG. 3D, including a pair of AND gates 200 and 202 and an OR gate 204 receiving the output of flip-flop 194 and a 'Select' input 206.

The analog input waveform to the ADC, shown in FIG. 3B, alternates between the two low frequency stimuli, on each successive input sample to the ADC. The clock provided to the ADC is preferably the maximum speed that the ADC can accommodate, and the low frequency stimulus preferably has the maximum amplitude that the ADC can accommodate, so that the ADC's input waveform contains the maximum frequencies and amplitudes that the ADC can accommodate.

The digital output of the ADC is sampled by N-bit register 196 that is clocked by a low frequency sampling clock output from phase selector 198. The sampling signal applied to the sampling register is a periodic pulse whose period is preferably an integer multiple of the period of the analog multiplexer clock. The pulse width of the sampling signal is not important because a sampling register is typically only sensitive to the rising edge or the falling edge of the sampling signal. External access to the register can be parallel or serial. There can be many ADC sampling clock cycles between each sampling register sample that is shifted out.

The sampling clock frequency of the tester can be chosen to ensure coherent sampling (defined later herein) of one of the low frequency stimuli, especially if the stimulus is sinusoidal. If the low frequency stimulus is a linear ramp, sampling clock edges can also be chosen to coincide with the end of each step of the ramp. In other words, the tester's sampling clock frequency and timing is chosen based on the properties of the low frequency stimulus of interest, almost independent of the ADC's sampling clock frequency. There will be some dependence on the sampling clock frequency of the ADC because the ADC output can only be sampled coincident with sampling edges of the ADC sampling clock.

A conventional CMOS transmission gate can be used for the sampling switch. For improved isolation between the ADC input and the unselected input voltage and when no sampling is occurring, a conventional T-gate, as shown in FIG. 4, can be used.

The quality of the ADC can be tested using conventional analysis of the output digital values, as though a low frequency ADC were being tested. For example, an output digitized sine wave can be analyzed using Fourier transforms. If the low frequency stimulus waveform is to be a linear ramp, a conventional (low frequency) servo loop can be used. In a conventional servo loop test method, the voltage applied to the ADC is adjusted until the ADC output varies uniformly around an initial target digital value, and then the voltage is measured; next the voltage is adjusted until the ADC output varies around a one-bit higher digital value and the voltage is then measured again; the difference between the measured voltages is then compared to an ideal step size to determine DNL; this procedure is repeated for all steps in the ADC's input range.

Again, some existing commercial ADCs have multiple channel inputs. For example, an ADC can have a 2-to-1 analog multiplexer connected between the ADC input and two signal pins. This allows multiple DC or low frequency signals to be monitored by a single ADC. It is possible to use this multiplexer as the high frequency analog multiplexer mentioned earlier herein, with one input connected to, for example, a low frequency sine wave, and the second input connected to, for example, a DC voltage; the selector signal is preferably driven at one half the ADC's sampling clock frequency.

Additional Signal Processing

Harmonic distortion is a parameter that is typically measured for ADCs, DACs, and mixed-signal circuits. The most common method is to apply a sinusoidal stimulus at a single frequency, sample the output signal coherently, and use Fourier analysis to determine the phase and amplitude of the signal at many different frequencies including those that are an exact integer multiple of the stimulus frequency.

To sample coherently means to sample at a rate, $f_S$, to collect N independent samples from M cycles of a sinusoidal signal having fundamental frequency $f_T$. To achieve this, it is well known to those skilled in the art that the frequencies should be chosen such that $f_T/f_S=M/N$ where M and N are relatively prime integers (i.e., have no common factors other then 1). For example, if the ADC sample rate, $f_S$, is 10 MHz, and the number of samples needed is 1024, then 253 cycles could be sampled of a sinusoidal stimulus having a frequency $f_T=f_S \times M/N=10,000,000 \times 253/1024 \approx 2.47$ MHz. The total sample collection time would be $N/f_S=1024/10$ MHz= 102.4 microseconds.

It is possible to coherently under-sample a DAC or ADC output by some integer factor: for example, every thousandth DAC or ADC output value could be sampled, so that $f_S=10$ MHz/1,000=10 kHz. For this case, M would be 253,000 cycles, and the total sample collection time would be $N/f_S=1024/10,000 = 102.4$ milliseconds.

With the method of the present invention, $f_T$ (before multiplexing with the second low frequency or DC signal) and $f_S$ can both be much lower than the converter's sample rate. For example, to collect 1024 independent samples for a 10 MHz ADC or DAC, the ADC or DAC output could be sampled at 10 kHz, and 253 cycles of a 2.47 kHz sinusoidal signal could be sampled. The total sample collection time would be 1024/10,000=102.4 milliseconds.

Inter-modulation distortion (IMD) is another parameter that is often measured for ADCS, DACS, and mixed-signal circuits. This type of distortion is typically measured by using a stimulus signal that is the arithmetic sum of two single-frequency sinusoidal signals (differing in frequency by less than 10%, for example), and measuring the output signal amplitude at frequencies that are not integer multiples of either input frequency. For an ADC or DAC, intermodulation distortion can be caused by one analog sample affecting the subsequent analog sample. With the method of the present invention, this phenomenon can be measured directly.

When sampling the DC voltage, as shown in FIG. 2C and in FIG. 3C, the expected output value for an ideal converter is DC. If there is significant inter-modulation distortion, then the output "DC" signal may in fact contain a small amount of the low frequency sinusoidal signal during the un-sampled output time slots. The DC signal should be sampled coherently with respect to the low frequency sinusoidal signal so that the harmonically related components in the "DC" signal can be measured accurately.

The nature of a DAC's analog output signal during the transition from its value in one sample clock period value to its value in the next sample clock period can be captured by adjusting the sampling pulse duration and phase. For example, the sampling edge can be shifted to a point mid-way between the sampling instants shown in FIG. 2B and FIG. 2C, so as to sample the slewing section of the waveform. The coarseness of the adjustment can be in terms of edges of the sampling clock, or it can be much finer if a digitally controlled adjustable delay line is used. The width of the sampling pulse can be reduced in duration similarly by using adjustable digital delays, so as to capture the waveform's value at any instant in time.

Similarly, the response of an ADC to a rapidly changing waveform can be captured by adjusting the phase of the multiplexer select signal. For example, the ADC's sampling instant can be shifted to a point mid-way between the sampling instants shown in FIG. 3B and FIG. 3C, so as to sample the slewing section of the waveform.

Testing Other Mixed-Signal Circuits

The analog waveform stimulus shown in FIG. 3B can be applied to other mixed-signal and analog circuits. If the circuit generates a digital response, the response can be sampled as described for the DAC of FIG. 3A; if the circuit generates an analog response, the response can be sampled as described for the ADC of FIG. 2A.

Analog Switch

FIG. 4, illustrates a CMOS transmission gate arrangement 210 which is used in other prior art analog applications and which has superior signal isolation properties when disabled. The circuit technique, known as a T-switch because of its topology, is commonly used for CMOS switches that convey high frequency signals. The T-switch has an input A1 to receive an input signal and an output A2 to provide an output signal. The enable signal on line 212 activates or deactivates the T-switch. When enable line is high or active, transistor pairs 214 and 216 are turned ON and transistor 218 is turned OFF. Hence, when the enable signal is high, the T-switch is activated and a low impedance path, i.e., a conductance path including only the "ON" resistance of transistor pairs 214 and 216 in series, is provided between input A1 and output A2, thereby permitting a signal at input A1 to be delivered to output A2. Conversely, when the enable signal is low or inactive, transistor pairs 214 and 216 are turned OFF and transistor 218 is turned ON. Thus, when the enable signal is low, the T-switch is deactivated and the impedance of the path from input A1 to output A2 is much higher and equal to the impedance of the "OFF" impedance of transistor pairs 214 and 216 in series. When the T-switch is deactivated, transistor 218 provides a low impedance path from center node 220 to ground node GND. Therefore, when the T-switch is deactivated, much of the unselected input signal that normally would leak through to the output is shunted from node center node 220 to ground.

This circuit is not, however, optimized for high speed sampling because the capacitance between the sampling clock and the conveyed signal is double that of a single CMOS transmission gate having equal series ON resistance, and because the center node 220 must be continually recharged by the sampled signal each time the gate is enabled.

Figure 5A:
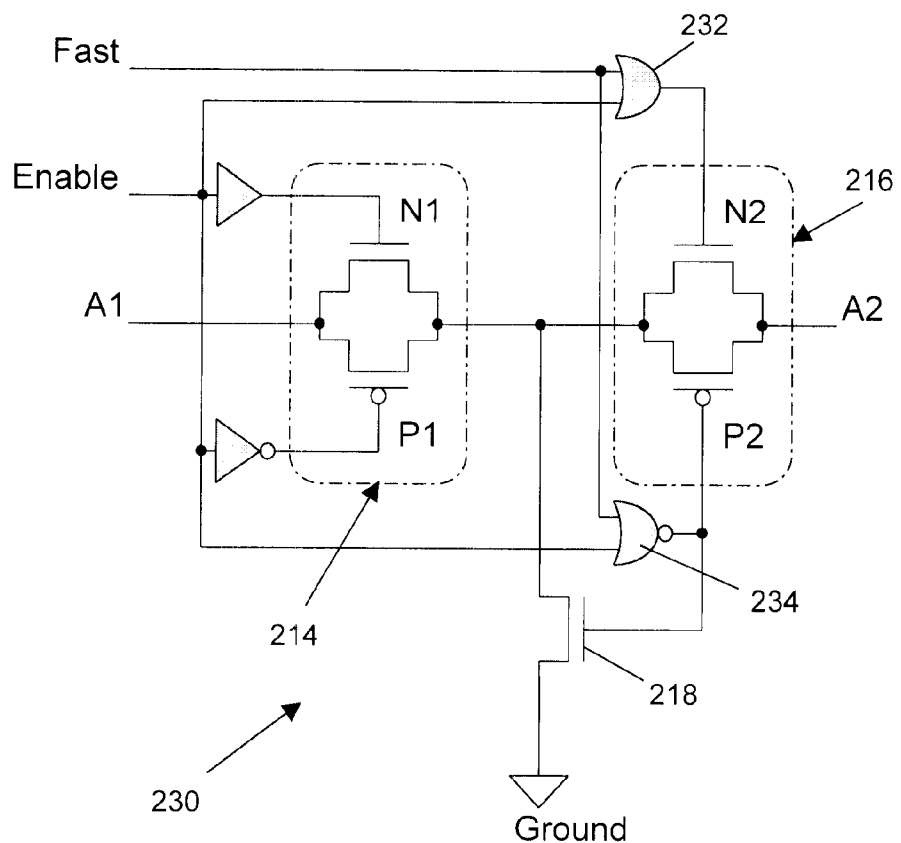
FIG. 5A is a schematic of a circuit that is an improved T-switch according to an embodiment of the present invention.
Figure 5B:
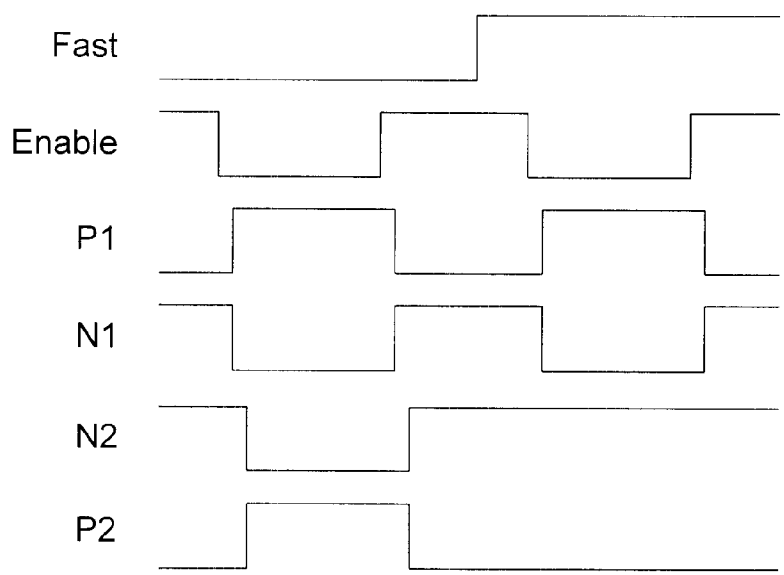
FIG. 5B shows waveforms for signals in the circuit of FIG. 5A.

To allow high speed switching operation during test mode, and maximal signal isolation when not in test mode, the analog T-switch 230 shown in FIG. 5A can be used instead of the prior art type shown in FIG. 4. FIG. 5A uses the same reference numerals as FIG. 4 to designate the same parts. The T-switch of FIG. 5A differs from that in FIG. 4 in that the two CMOS transmission gates N1/P1 and N2/P2 (transistor pairs 214 and 216, respectively) are controlled separately. T-switch 230 includes an OR gate 232 and a NOR gate 234 each of which receiving a signal, FAST, and the Enable signal. As shown in FIG. 5B, when the switch is being used to sample in test mode, signal FAST is active and, thus, transmission gate pair 216 is continuously enabled and the grounding switch 218 is continuously disabled. When not in test mode, when FAST is inactive, both the switch 214 and switch 216 are enabled only by the Enable signal, and the grounding switch 218 is only enabled when both switches 214 and 216 are disabled.

Compared to the prior art T-switch, the T-switch 230 has the same isolation when Fast=0, but about 50% less capacitance between the sampling clock and signal A1 when Fast=1. Also, if a conventional T-switch is used to sample the output of an ADC, the center node of the T will be alternately connected to ground and to the sampled signal. This can cause signal degradation because the center node is continuously charged and discharged. The proposed T-switch does not have this problem as the center node is continuously connected to the capacitance, or continuously connected to the ADC signal, depending on which side of the T is connected to the ADC. In summary, using the proposed T-switch with the method of the present invention achieves better signal-to-noise ratio, faster switching speeds, and lower power dissipation.

Compensating for Leakage Current in the Capacitance

Figure 6:
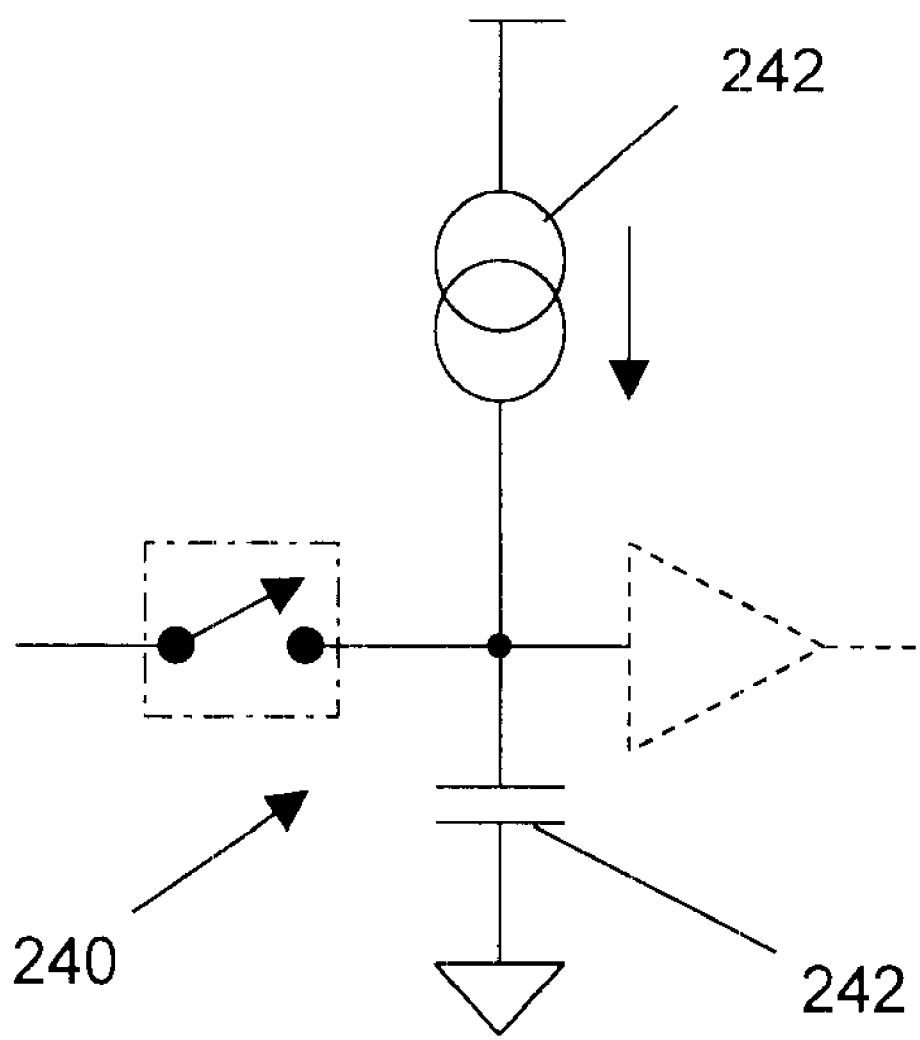
FIG 6 is a schematic of circuit according to an embodiment of the present invention, that reduces the effect of leakage current through a capacitance by including a current source whose value is equal to the leakage current.

During the time between sampling pulses in the circuit of FIG. 2A, signals stored across the capacitance can decay due to leakage current. This can contribute noise and distortion. FIG. 6 shows a circuit 240 to minimize this decay. The voltage on capacitor 242 is driven to a mid-range DC voltage, and the current required to keep the voltage at the constant voltage is measured. This current will be equal to the leakage current. For example, a typical leakage current is a value between 1 and 10 microamps. Next, a current source 242 is connected to the capacitance with a current equal to the measured leakage current. Thereafter, the decay of voltages stored across the capacitance will be minimized, regardless of the sampling frequency.

Method and Circuit According to IEEE 1149.4 Standard

It is desirable to be able to combine the present invention with a circuit that is constructed according to the IEEE 1149.4 standard for a mixed-signal test bus, in a way that enables the use of short duration sampling pulses and in a way that ensures maximal isolation between the pin signals that are being tested and those that are not being tested.

Figure 7A:
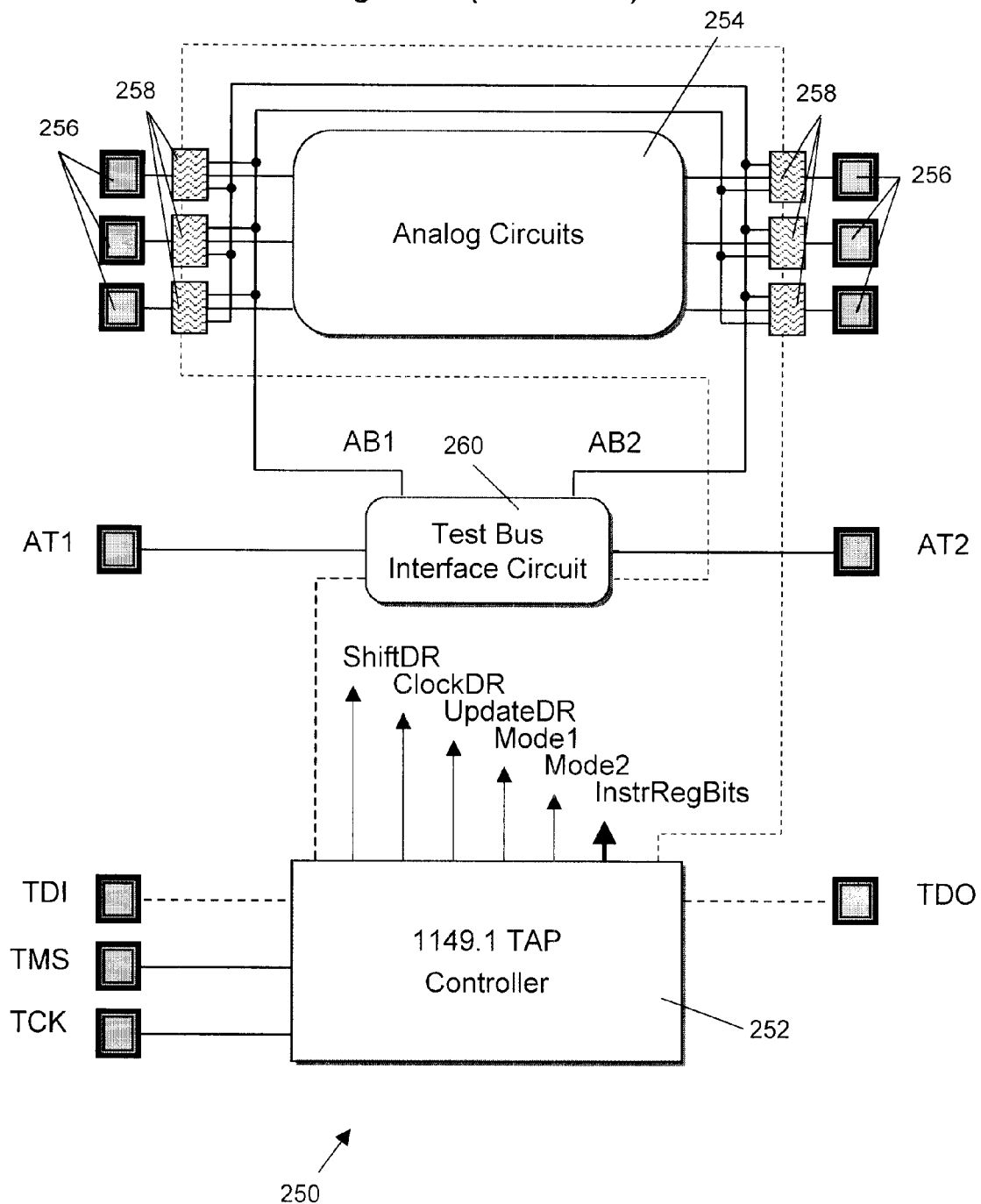
FIG. 7A is a schematic of a circuit constructed according to the IEEE 1149.4 standard for a mixed signal test bus, and including analog boundary scan modules (ABMs)

By way of background, FIG. 7A illustrates the general architecture of an IC 250 which contains IEEE 1149.4 test access circuitry. The circuit includes a TAP controller 252 having a test clock input, TCK, a Test Mode Select input, TMS, for sequencing the controller through the 16 states prescribed by the standard, a Test Data Input, TD1, for loading (or "shifting" or "scanning") logic values into the IC and a Test Data Output, TDO, for unloading data out of the IC. The IC further includes internal analog circuits 254 and may also include internal digital circuits not shown. The analog circuitry is connected to circuit nodes or pins 256 by means of analog boundary modules 258. A pair of busses AB1 and AB2 connect each of analog boundary modules 258 to a test bus interface circuit 260. The busses are used to monitor or drive circuit nodes according to the IEEE 1149.4 standard. Common signals generated by the TAP to control all ABMs may include ShiftDR, ClockDR, UpdateDR, Mode signals, Mode1 and Mode2, and instruction register bits, InstrRegBits.

Figure 7B:
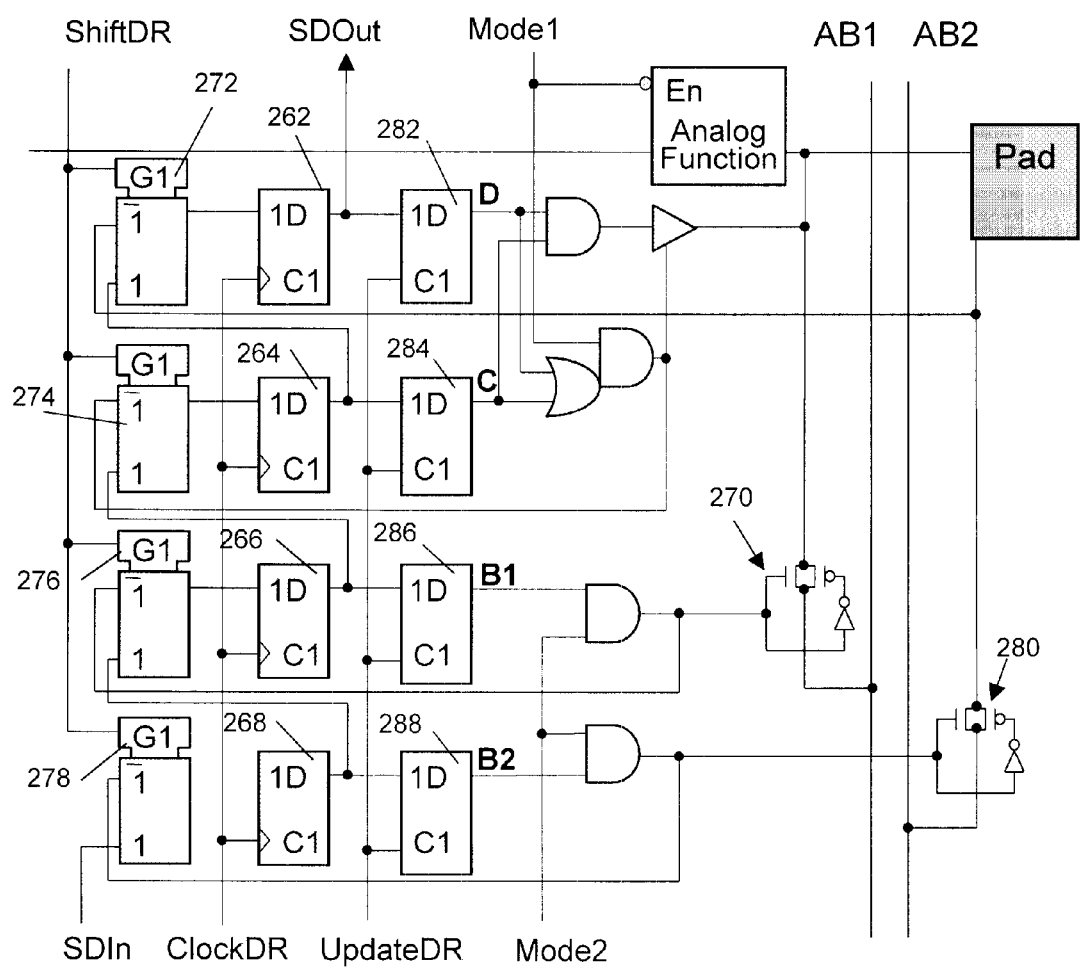
FIG. 7B is a schematic of an ABM constructed according to the IEEE 1149.4 standard.

FIG. 7B illustrates an analog boundary module 258. Shift register elements 262, 264, 266 and 268 are serially connected between a module Scan Data Input, SDIn, and a Scan Data Output SDOut, which are serially connected to other modules along a predetermined scan path. The ShiftDR signal output by the TAP is connected to multiplexers 272, 274, 276 and 278 and serves to configure shift register elements 262, 264, 266 and 268 in a shift or scan mode when active and in a capture mode when inactive. Update latches 282, 284, 286 and 288 are associated with shift register elements 262, 264, 266 and 268, respectively, and are controlled by TAP controller UpdateDR output signal. Analog switches 270 and 280 are switches 230 of FIG. 5A and are controlled by a Mode signal output by the TAP and the logic values in update latches 286 and 288, respectively. The switches are enabled by loading a switch enabling bit, logic 1, into their associated update latches.

Figure 8A:
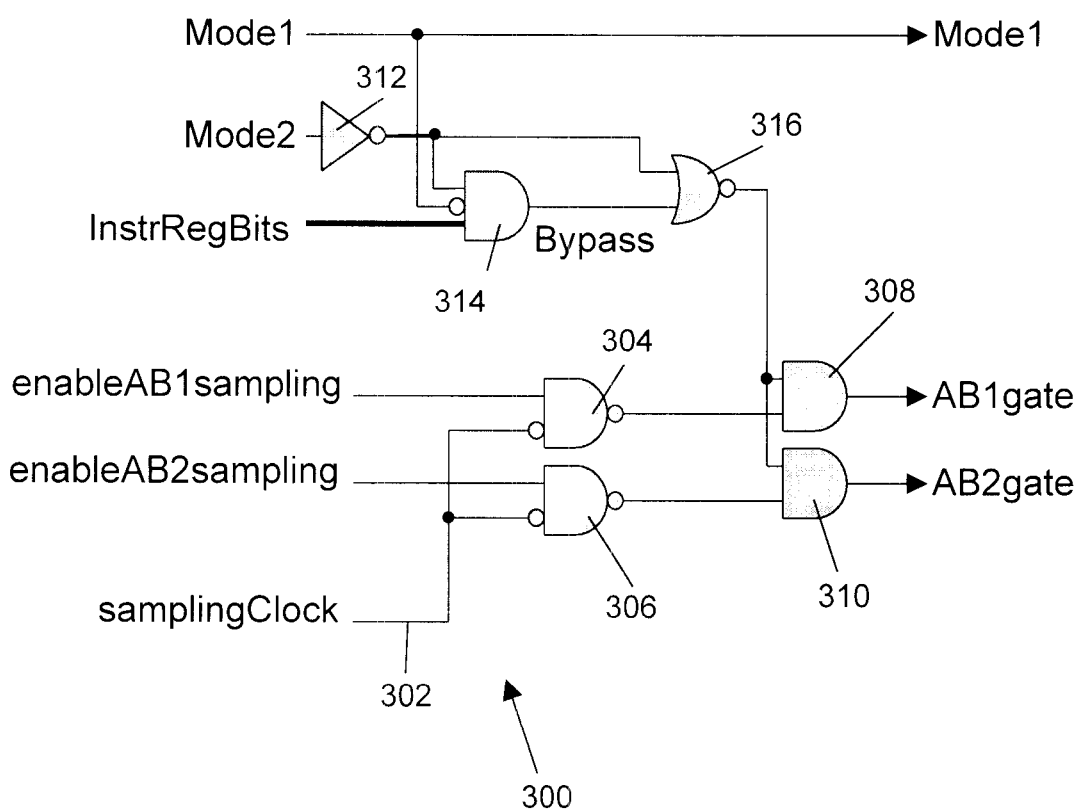
FIG. 8A is a schematic of a circuit, according to an embodiment of the present invention, having a sampling clock selectably controlling a mode signal that originates in the circuit FIG. 7A and terminates in each of a plurality of ABMs.
Figure 8B:
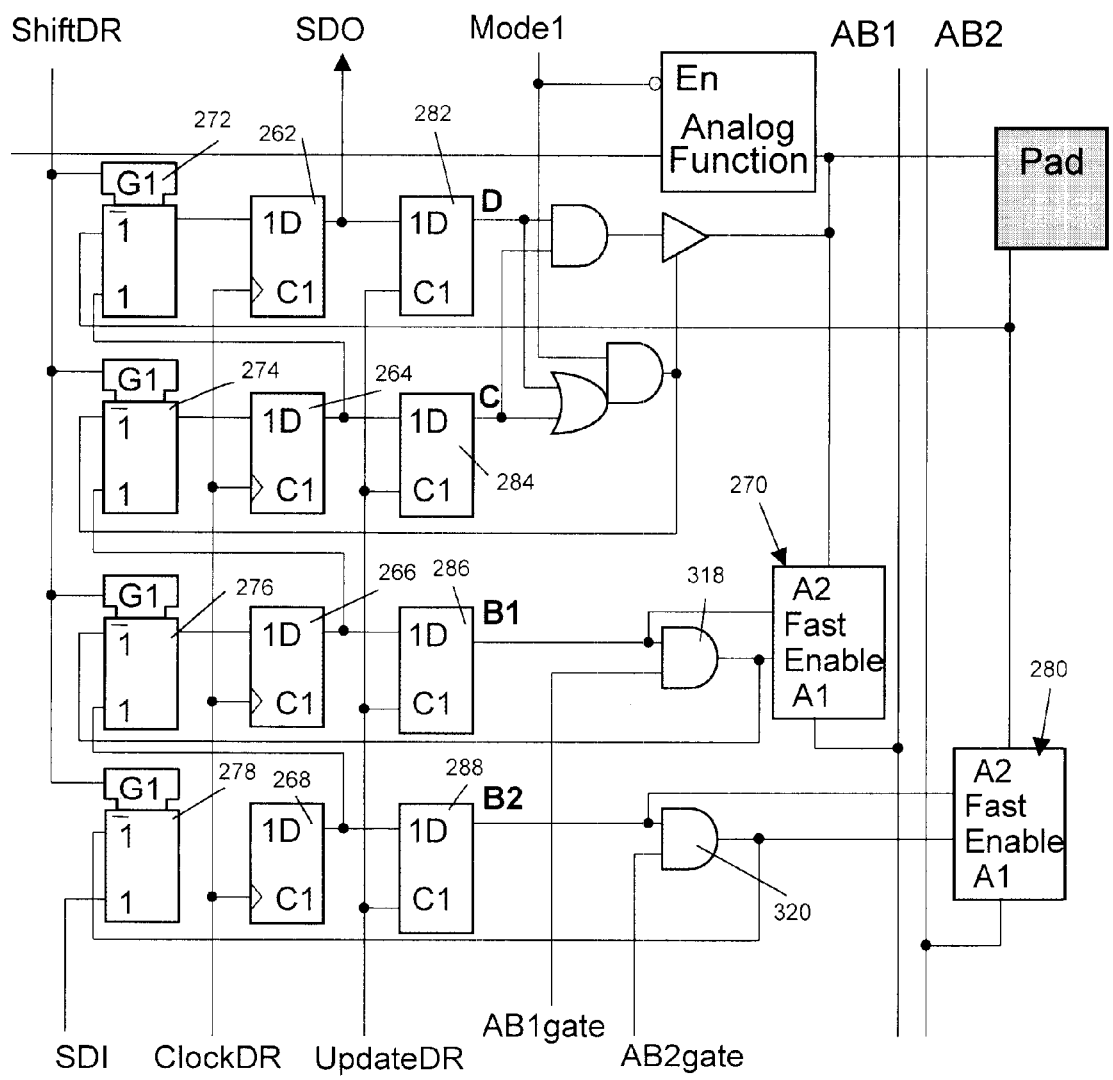
FIG. 8B is a schematic of a circuit that implements an ABM including the improved T-switch of FIG. 5A, and constructed according to an embodiment of the present invention and according to the IEEE 1149.4 standard.

FIG. 8A illustrates a circuit 300 that combines a sampling clock 302 with the TAP controller output signal, Mode2, common to all the ABMs, one or more of which operate like an ABM constructed according to the present invention as shown in FIG. 8B.

Circuit 300 includes two NAND gates 304 and 306 which receive control bits enableAB1sampling and enableAB2sampling. The outputs of two NAND gates 304 and 306 are applied to an input of respective AND gates 308 and 310, which produce signals AB1gate and AB2gate, respectively. The Mode2 is applied to an inverter 312 the output of which is applied to one input of each of an AND gate 314 and a NOR gate 316. NOR gate 316 also receives the output of AND gate 314. AND gate 314 receives one or more instruction register bits, labeled InstrRegBits, all of which are logic 1 whenever the BYPASS instruction is active, and an inverted Mode1 signal. Referring to FIG. 8B, it will be seen that the B1 and B2 bits are applied to the Fast input of switches 270 and 280, respectively and the outputs of AND gates 318 and 320 are applied to the Enable input of switches 270 and 280, respectively.

In conventional operation, control bits enableAB1sampling and enableAB2sampling are logic 0, and Mode1 and Mode2 control the ABMs in the same way as in the prior art (FIG. 7B). If enableAB1sampling is set to logic 1, and an ABM's B1 bit is also set to logic 1, then a corresponding T-switch will be enabled when the sampling clock is logic 1 and disabled when the sampling clock is logic 0. The same applies to enableAB2sampling, an ABM's B2 bit, and a corresponding T-switch.

The circuit of FIG. 8B shows the T-switches of FIG. 5A, but any other switch could be used, including a conventional T-switch or CMOS transmission gate. T-switches are recommended in the 1149.4 standard to provide sufficient isolation between analog bond pad signals and the analog buses signals. Therefore, if high frequency sampling is to be performed, the switch of FIG. 5A provides better performance because it has the recommended T-structure but has less clock-to-signal capacitance than the recommended T-switch.

An 1149.4 circuit constructed according to the present invention can test high frequency ADCs, DACs, and other mixed-signal or other analog circuits, without having to convey high frequency signals on the analog buses AB1, AB2, AT1, or AT2. This capability greatly improves the utility of the 1149.4 mixed-signal test bus. The only high frequency signals needed for the method of the present invention are digital signals, and prior art circuit techniques can be used to generate these digital signals within an IC. For a first example, a phase-locked loop (PLL) can generate a high frequency clock signal that is phase synchronized to a low frequency clock signal, and the high frequency clock can drive, for example, a high frequency DAC as described earlier herein. For a second example, a simple logic delay can be used to generate a narrow sampling pulse for each rising edge or for each falling edge of a low frequency digital clock, and this pulse can under-sample a much higher frequency analog signal. For either example, the resulting sampled analog signal will be low frequency and this low frequency signal can be sampled coherently or non-coherently by a tester.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. A method for testing an analog, or mixed analog and digital, circuit that operates at a clock frequency, the method comprising:

multiplexing a plurality of low frequency stimulus signals using a high frequency clock to produce a high frequency input stimulus signal, at least one of said low frequency stimulus signals being a continuously changing signal;

applying said input stimulus signal to a circuit under test so as to obtain a circuit output signal;

sampling said circuit output signal synchronously with said high frequency clock at a frequency equal to the clock frequency divided by the number of said plurality of said low frequency stimulus signals to produce a sequence of samples;

storing said samples; and measuring properties of said samples to determine properties of said circuit.

2. A method as defined in claim 1, wherein said stimulus signals are digitally-encoded equivalents to analog signals.

3. A method as defined in claim 1, wherein a plurality of said stimulus signals has an unchanging value.

4. A method as defined in claim 1, further including:
said high frequency clock having a frequency that is the maximum frequency that said circuit under test can accommodate; and
one of said low frequency stimulus signals having an amplitude which is substantially equal to the maximum amplitude that the circuit can accommodate, whereby the waveform of said input stimulus signal contains the maximum frequency and amplitude that said circuit under test can accommodate.

5. A method as defined in claim 1, wherein said circuit is an analog-to-digital converter (ADC).

6. A method as defined in claim 1, wherein said circuit is a digital-to-analog converter (DAC).

7. A method as defined in claim 1, wherein said storing including temporarily storing each said sample in a digital register.

8. A method as defined in claim 1, said sampling comprising sampling by means of a CMOS transmission gate.

9. A method as defined in claim 1, wherein said multiplexing comprising using a number, J, of CMOS transmission gates arranged to form a J-to-1 analog multiplexer, where J is equal to the number of said low frequency signals.

10. A method as defined in claim 1, wherein said sampling including sampling synchronously by a switch comprising a first CMOS transmission gate and a serially connected second CMOS transmission gate, a grounding transistor connected to an intermediate series node, said first gate performing synchronous sampling, said second gate being selectably enabled continuously, and said grounding transistor being selectably disabled continuously.

11. A method as defined in claim 1, wherein said multiplexing including applying said low frequency stimulus signals to a plurality of switches corresponding in number to the number of said low frequency stimulus signals and arranged to form an analog multiplexer, each switch comprising a first CMOS transmission gate and a serially connected second CMOS transmission gate, a grounding transistor connected to an intermediate series node; said first gate being connected to a selector input signal of said multiplexer, said second gate being selectably enabled simultaneously with said first gate or being enabled continuously, and said grounding transistor being selectably disabled when either first or second gate is enabled or disabled continuously.

12. A method as defined in claim 1, said sampling including selectably sampling a portion of said output signal corresponding to one of said plurality of stimulus signals, and applying consecutive samples to a common storage circuit.

13. A method as defined in claim 1, wherein said stored samples being analog, said sampling further including temporarily holding each said sample across a capacitor that is selectably a single capacitor or a plurality of capacitors connected in parallel.

14. A method as defined in claim 1, said sampling comprising sampling said circuit output signal during transition of said stimulus signal from one of said plurality of stimulus signals to another of said plurality of stimulus signals.

15. A method as defined in claim 1, said sampling including sampling by means of a CMOS transmission gate having a sampling pulse duration which is significantly less than one half of the period of said clock frequency.

16. A method as defined in claim 1, said sampling including directly sampling a known signal at a rate equal to said clock frequency divided by the number of said low stimulus signals; and analyzing analog samples to determine the performance, including offset or non-linearity, of sampling circuitry, and using analysis results to compensate the measured performance of said circuit under test.

17. A method as defined in claim 1, wherein said storing including temporarily storing each said sample in a capacitor.

18. A method as defined in claim 17, said method being preceded by determining leakage current associated with said capacitor and connecting a current source to said capacitor for supplying thereto a current equal to said leakage current.

19. A method as defined in claim 1, wherein the number of said plurality of stimulus signals is two.

20. A method as defined in claim 19, said two stimulus signals being inverted with respect to each other and comprise a differential signal.

21. A method as defined in claim 1, wherein said stimulus signals are analog signals.

22. A method as defined in claim 21, said sampling including directly sampling said analog stimulus signals by an analog circuit at a rate equal to said clock frequency divided by the number of low frequency analog stimulus signals, further including analyzing analog samples to determine the performance, including offset or non-linearity, of a multiplexer which multiplexes said stimulus signals and using the analysis results to compensate the measured performance of said circuit under test.

23. A method as defined in claim 22, wherein said analog circuit is also the circuitry used to sample the output of said circuit under test.

24. A method for testing an analog, or mixed analog and digital, circuit that operates at a clock frequency, the method comprising:
multiplexing a plurality of low frequency stimulus signals under control of a high frequency clock to produce a high frequency input stimulus signal, at least one of said low frequency stimulus signals having an unchanging value and one of said low frequency stimulus signals having an amplitude substantially equal to the maximum amplitude that the circuit can accommodate;
applying to said circuit a clock signal having a frequency that is the maximum frequency that the circuit can accommodate;
applying said input stimulus signal to a circuit under test so as to obtain a circuit output signal;
sampling said circuit output signal synchronously with said high frequency clock at a sampling frequency equal to said clock frequency divided by the number of said plurality of low frequency stimulus signals to produce a sequence of samples, said sampling including producing a sampling pulse having a duration which is significantly less than one half of the period of said clock frequency;
storing said samples; and
measuring properties of the signal samples to determine properties of said circuit under test.

25. A method as defined in claim 24, further including performing said sampling during transitions from one of said low frequency stimulus signal to the next low frequency stimulus signal in sequence.

26. A method as defined in claim 24, said stimulus signals being analog signals, further including sampling said analog stimulus signals directly at a rate equal to said clock frequency divided by the number of stimulus signals and analyzing analog samples to determine the performance, including offset or non-linearity, of a multiplexer used to multiplex said stimulus signals and using the analysis results to compensate the measured performance of said circuit under test.

27. A method as defined in claim 24, said sampling including directly sampling a known signal at a rate equal to said clock frequency divided by the number of said low stimulus signals; and analyzing analog samples to determine the performance, including offset or non-linearity, of sampling circuitry, and using analysis results to compensate the measured performance of said circuit under test.

28. A circuit for testing an analog, or mixed analog and digital, circuit that operates at a clock frequency, the circuit comprising:

a multiplexer for multiplexing a plurality of low frequency stimulus signals;

multiplexer control means for producing a multiplexer select signal under control of a high frequency clock to cause said multiplexer to sequentially select each said plurality of low frequency stimulus signals and produce a high frequency stimulus signal for application to a circuit under test;

an analog sampling switch for sampling an output signal of said circuit under test in synchronism with said high frequency clock and at a frequency equal to the clock frequency divided by the number of said plurality of low frequency stimulus signals;

a capacitance for storing samples produced by said sampling switch, said switch being connected between said output signal of said circuit under test and said capacitance; and means for measuring properties of said samples to determine properties of said circuit under test.

29. A circuit as defined in claim 28, said sampling means including means for applying a sampling signal to said sampling switch, said sampling signal being a periodic pulse whose frequency is the same as that of said multiplexer select signal and whose width is significantly less than 50% of the period of said pulse.

30. A circuit as defined in claim 28, said high frequency clock being the maximum speed that the circuit under test can accommodate and said low frequency stimulus signal having the maximum amplitude that the circuit under test can accommodate so that the waveform of the output signal of said circuit under test contains the maximum frequencies and amplitudes that said circuit under test can accommodate.

31. A circuit as defined in claim 28, each said low frequency stimulus signal being a signal selected from the group including a single frequency sine wave, a multiple frequency sine wave, single linear ramp, a periodic linear ramp, random values, or DC.

32. A circuit as defined in claim 28, said switch being a CMOS transmission gate.

33. A circuit as defined in claim 28, said switch being a T-switch.

* * * * *